United States Patent
Huber et al.

(10) Patent No.: US 9,470,768 B2
(45) Date of Patent: *Oct. 18, 2016

(54) COOLING DEVICE FOR A GRADIENT COIL AND USE THEREOF

(71) Applicant: Siemens Aktiengesellschaft, München (DE)

(72) Inventors: Norbert Huber, Erlangen (DE); Lothar Schoen, Neunkirchen (DE); Stefan Stocker, Grossenseebach (DE); Muris Torlak, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 969 days.

This patent is subject to a terminal disclaimer.

(21) Appl. No.: 13/625,081

(22) Filed: Sep. 24, 2012

(65) Prior Publication Data

US 2013/0075068 A1    Mar. 28, 2013

(30) Foreign Application Priority Data

Sep. 22, 2011    (DE) .................. 10 2011 083 204

(51) Int. Cl.
  *F28F 3/00* (2006.01)
  *B23P 15/26* (2006.01)
  *G01R 33/385* (2006.01)

(52) U.S. Cl.
  CPC ...... *G01R 33/3856* (2013.01); *Y10T 29/49366* (2015.01)

(58) Field of Classification Search
  CPC ............... G01R 33/3856; Y10T 29/49366; Y10T 29/4935; F28D 9/0087; H01F 27/2876; H01F 27/10; H01F 27/22
  USPC ...... 324/318, 319, 322; 165/168; 29/890.03, 29/890.039
  See application file for complete search history.

(56) References Cited

U.S. PATENT DOCUMENTS

| | | |
|---|---|---|
| 7,463,029 B2 | 12/2008 | Schuster et al. |
| 7,884,606 B2 | 2/2011 | Schuster et al. |
| 2001/0042385 A1 | 11/2001 | Kaindl et al. |
| 2007/0247156 A1 | 10/2007 | Schuster et al. |
| 2008/0024134 A1* | 1/2008 | Schuster et al. ............ 324/319 |
| 2008/0030194 A1* | 2/2008 | Gromoll et al. ............ 324/322 |
| 2008/0204179 A1 | 8/2008 | Schuster et al. |

FOREIGN PATENT DOCUMENTS

| | | |
|---|---|---|
| CN | 101122632 A | 2/2008 |
| DE | 10 2006 014 305 A1 | 10/2007 |
| DE | 10 2007 009 204 A1 | 8/2008 |

* cited by examiner

*Primary Examiner* — Melissa Koval
*Assistant Examiner* — Rishi Patel
(74) *Attorney, Agent, or Firm* — Laurence Greenberg; Werner Stemer; Ralph Locher

(57) ABSTRACT

A cooling device for disposal between two flat coils of a gradient coil has at least one first and with at least one second foil that are connected to each other in areas such that continuous cooling channels for a cooling fluid are formed. The cooling channels are branched, whereby an improved cooling effect is produced with a smaller thickness of the cooling device.

21 Claims, 5 Drawing Sheets

# COOLING DEVICE FOR A GRADIENT COIL AND USE THEREOF

CROSS-REFERENCE TO RELATED APPLICATION

This application claims the priority, under 35 U.S.C. §119, of German application DE 10 2011 083 204.1, filed Sep. 22, 2011; the prior application is herewith incorporated by reference in its entirety.

BACKGROUND OF THE INVENTION

Field of the Invention

The present invention relates to a cooling device to be disposed between two flat coils of a gradient coil and to a method for using the cooling device. The cooling device has at least one first foil and at least one second foil which are connected to each other in areas such that continuous cooling channels for a cooling fluid are formed.

Gradient coils of magnetic resonance tomographs consist of electrical coils for local encoding of the magnetic resonance (MR) signal in the three Cartesian spatial directions. The coils are disposed as a rule in a number of layers on a cylinder surface. Water cooling tubes or mats are arranged as cooling layers between the layers of coils, to enable the significant amounts of heat of the coil systems occurring during operation to be removed and to enable the temperature to be kept below a critical value. The coils and cooling layers are bandaged in each case and vacuum sealed in their entirety.

The further away lines for generating a gradient field are from the center of the cylinder surface, the higher is the required current needed to generate desired or required field strengths in the center. I~$R^5$ applies, with I being the current through the coil and R an inner radius of a cylindrical coil. The ohmic losses in the conductors or the heat resulting therefrom are proportional to $I^2$. The aim is therefore to dispose the coil conductors as close as possible to the center in which for example the patient to be examined is disposed. To this end the coils and the cooling layers arranged between them must be as thin as possible.

Known cooling layers are constructed from cooling tubes running in parallel which are disposed tightly packed in a serpentine shape in the cooling layer. The thickness of the cooling tubes means that the minimum thickness of the cooling layer amounts to more than 5 mm. Several hundred meters of cooling tube, which must be arranged during production in a complex manner by hand in plastic carrier mats, are necessary for a gradient coil. In this arrangement only a poor cooling effect is achieved at the turning points of the tubes. If during production a channel constriction occurs at just one point of the cooling tube, then because of the linear channel structure of a cooling layer consisting of one cooling tube, the cooling effect of the entire cooling tube is adversely affected.

As an alternative, plates with regularly disposed, channel-forming cutouts can be used, which are stacked above one another to form a cooling mat. Such a cooling mat is for example known from published, non-prosecuted German patent application DE 10 2007 009 204 A1, corresponding to U.S. Pat. No. 7,884,606. To form the mat, coils are shaped and stacked above one another. The foils are connected to one another by welding or gluing for example. The known cooling mats with pit-shaped structures do not have a good cooling effect however.

SUMMARY OF THE INVENTION

The object of the present invention is therefore to specify a cooling device to be disposed between two flat coils of a gradient coil and a method for the use thereof, which exhibit a better cooling effect, are simple and low-cost, with the cooling device having a small thickness.

The specified object is achieved in relation to the cooling device for disposal between two flat coils of the gradient coil with the features according to the claims and in relation to the method for use of the cooling device with the features according to the claims.

Advantageous embodiments of the inventive cooling device and the method for use thereof emerge from the respectively assigned dependent subclaims. In such cases the features of the main claim can be combined with features of the subclaims and features of the subclaims can be combined with one another.

The inventive cooling device to be disposed between two flat coils of a gradient coil has at least one first and at least one second foil which are connected to one another in areas such that continuous cooling channels for a cooling fluid are formed. The continuous cooling channels are branched.

The branching of the cooling channels achieves an improved cooling effect compared to a single linear cooling channel structure in accordance with the prior art described above. Cooling fluid can be exchanged not only in the direction of the flow but also transverse thereto and can transport heat. Even if there is a constriction at a point in the cooling channel a cooling fluid can flow almost unhindered via the branch in the cooling device.

The cooling channels can be embodied between precisely two foils, especially in a straight and/or curved plane. The use of only two foils enables the cooling device to be manufactured very thin. Only two foils are able to be arranged above one another and connected in a cost-effective and simple manner.

In the connected areas of the foils continuous openings can be embodied through the stack of the at least two foils. These can be filled with casting compound for example. This produces a very thin, stable cooling device with which a gradient coil with a number of levels of coils and cooling devices can be manufactured, allowing a short distance between the coil levels and the center. The casting of the levels, with resin for example, leads to a high mechanical stability of the gradient coil.

The openings can have a diameter ranging from 5 to 20 mm. The distance between the openings, especially a regular distance of the openings from one another, can lie in the range of 20 to 50 mm. Openings with such a diameter and distance from one another enable a good casting, after the coils and cooling devices are stacked alternately in a stack above a cylinder for example. This means e.g., viscous resin can be well distributed through the openings within the gradient coil during casting.

Support sections of the at least two foils against one another can be embodied in the cooling channels, especially by point-type connections and/or point-type deep drawing of the at least two foils. During the manufacturing of the gradient coil or during stacking of the coil and cooling device levels above one another and/or during casting in, the support points prevent the cooling channels being closed off or restricted.

The overall cooling channel arrangement can essentially have a honeycomb pattern. In this case the code walls reflect the structure of the cooling channels. This pattern produces both a high mechanical stability and also well-branched cooling channels.

The material of the foils can be made of thermoplastic or can include thermoplastic. This material exhibits a good thermal conductivity with a small thickness, is cost-effective and simple to work, especially good to mold and/or to glue or to weld.

The foils can each have a material thickness ranging between 0.1 and 0.5 mm. The cooling device can have a thickness ranging between 1 and 5 mm. This is significantly thinner than cooling devices is known from the prior art, e.g. made of cooling tubes. This produces the previously described advantages for a gradient coil such as lower dielectric strength required for field strengths needed in the center and the lower heat development connected therewith, which in turn demands a lower necessary cooling power.

The at least one first and the at least one second foil can be connected to one another, especially for good thermal conductivity, by welding and/or gluing. This produces the advantages described above for thin cooling devices.

At least one inflow and at least one outflow channel for the cooling fluid can be included in the cooling device, especially with a channel width ranging from 10 to 50 mm and/or with a channel thickness which is the same for the at least one inflow channel and the at least one outflow channel. The cooling fluid can be supplied and taken away through the inflow and outflow channel. With the specified channel widths a backup of fluid and the reverse flows of cooling fluid against the direction of flow which occur under some circumstances can be prevented.

A cooling area is formed by the cooling channels and the at least one inflow channel and the at least one outflow channel can be disposed respectively on opposing sides of the cooling area. Fluid connections to the at least one inflow channel and the at least one outflow channel can be disposed on a common side.

At least one edge length, especially all edge lengths of the cooling device can lie in a range from 0.2 to 2 m. This produces cooling devices which are well suited to cooling gradient coils.

The inventive method for use of a cooling device described above contains the cooling device being used between two flat coils of a gradient coil of a magnetic resonance tomograph for removing heat arising when power is supplied to the flat coils by a cooling fluid flowing in the cooling device. Water can be used as the cooling fluid. Water is available cheaply in large quantities and has a high thermal capacity and thereby cooling effect. However other cooling fluids such as oils for example can be used.

A cooling device, especially a cooling device with minimized thickness, can be used between two respective flat coils.

The cooling devices and flat coils can be disposed in a number of layers above one another on a cylindrical surface. They can be used cast together with a resin.

The advantages associated with the method for using a cooling device are similar to the advantages which were described above in relation to the cooling device for disposal between two flat coils of a gradient coil.

Other features which are considered as characteristic for the invention are set forth in the appended claims.

Although the invention is illustrated and described herein as embodied in a cooling device for a gradient coil and use thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
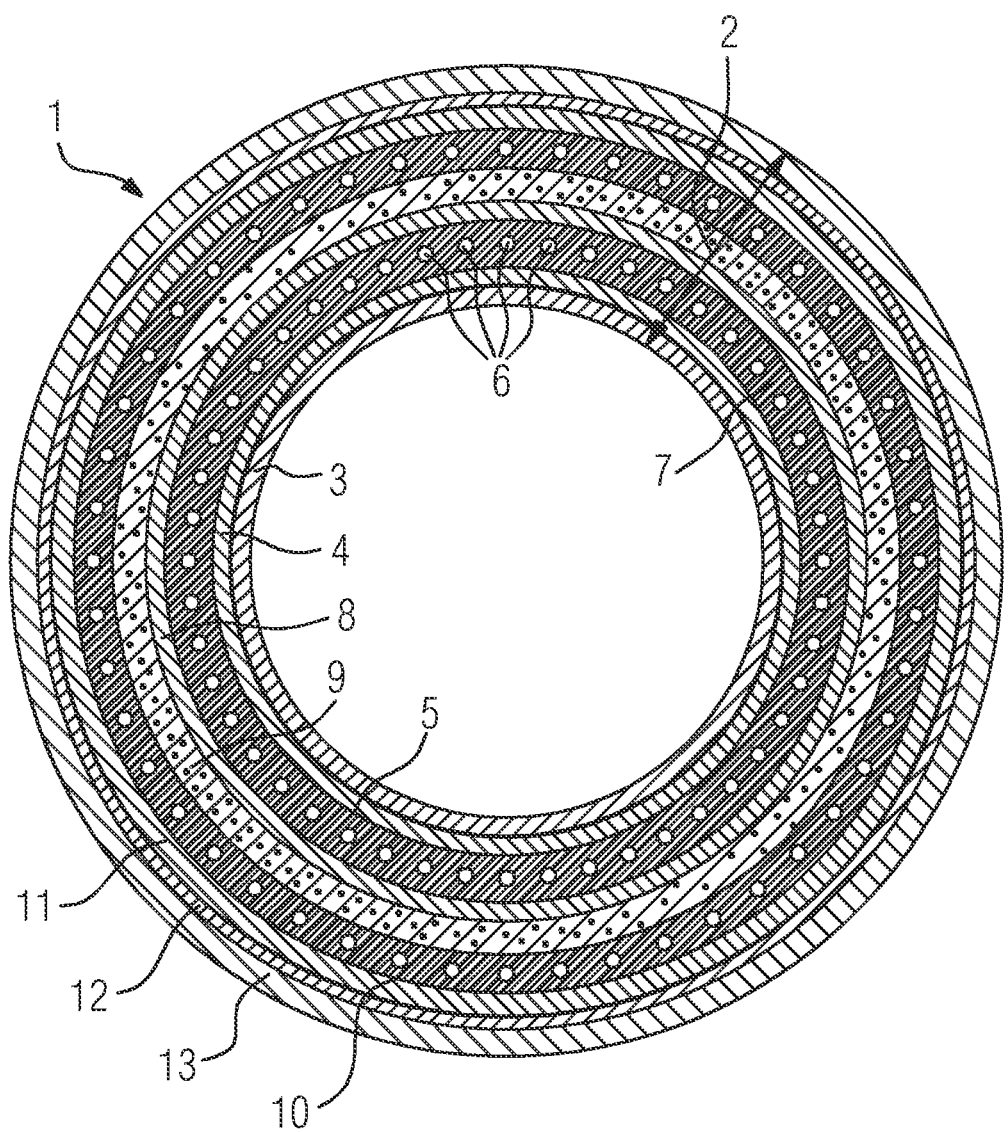
FIG. 1 is a diagrammatic, cross-sectional view of a gradient coil system with cooling lines in accordance with the prior art.

Referring now to the figures of the drawing in detail and first, particularly, to FIG. 1 thereof, there is shown a gradient coil system 1 according to the prior art. The gradient coil system 1 has a concentrically-arranged layer structure 2 like a hollow cylinder. The individual layers of the layer structure 2 are installed from inside to outside in a radial direction. A first hollow-cylindrical layer 3 is mounted on the curved surface of a cylindrical assembly aid, which for the sake of simplicity is not shown in FIG. 1. A second layer 4 is mounted on an outer curved surface of the first layer 3 etc.

The innermost two layers are a first gradient coil layer 3 and a second gradient coil layer 4 for generating a transversal gradient magnetic field in each case. The gradient coils built into the two gradient coil layers 3, 4 involve saddle coils.

These are adjoined as the next layer by a first cooling layer 5. This involves cooling lines 6 arranged in a serpentine form on an outer jacket surface of the second gradient coil layer 4 for removal of the heat generated by the gradient coil layers. The cooling lines 6 are fixed by sowing them onto a plastic carrier on which the gradient coils of the second gradient coil layer 4 are disposed.

The cooling lines 6 are embedded in a plastic matrix 7. Filler substances, which are not shown in the drawing and which improve the thermal conductivity of the plastic matrix, form a part of the plastic matrix.

A third gradient coil layer 8 for generating a longitudinal gradient magnetic field adjoins the first cooling layer 5. The third gradient cooling layer 8 contains axially disposed gradient coils. A so-called shim module 9 follows as the next layer. The shim module 9 contains pocket-shaped cavities disposed in the axial direction of the gradient coil system and not shown in FIG. 1 for receiving shim elements likewise not shown in the drawing, which essentially involve metal strips. The shim elements enable the static basic or main magnetic field to form and homogenize.

The shim module 9 is adjoined by a further second cooling layer 10 in which the cooling lines 6 are disposed and fixed in accordance with the way already described on the layer beneath them. Viewed in the radial direction outwards, the second cooling layer 10 is adjoined by a fourth gradient coil layer 11 for generating a longitudinal gradient magnetic field and also a fifth gradient coil layer 13 for generating two transversal gradient magnetic fields. The outer gradient coil layers 11, 12, 13 are principally constructed in the same way as the inner gradient coil layers 3, 4, 8. In this case they are configured so that they screen out stray fields outside the gradient coil system. It is guaranteed in this way that a gradient magnetic field only within the gradient coil system.

After the installation of all layers of the gradient coil system 1 the spaces between them are filled with a plastic, for example an epoxy resin or polyurethane, so that in particular the plastic matrix surrounding the cooling lines 6 is formed.

The first cooling layer 5 and the second cooling layer 10 are used to cool the total of six gradient coil layers 3, 4, 8, 11, 12, 13. The heat generated by the gradient coil layers 3, 4, 8, 11, 12, 13 is taken up by the plastic matrix 7, transferred to the cooling fluid flowing through the cooling lines 6 and transported away by the lines. A fluid based on water or oil serves as a cooling fluid.

The laying of the cooling lines 6 in a serpentine structure involves a large amount of work. There is also the fact that the layers of the layer structure of the gradient coil system are mostly concentrically-disposed hollow cylinders. Here the cooling lines 6 must be disposed on a curved surface. So that the cooling lines definitely remain in their serpentine structure before casting with a plastic matrix, the individual cooling lines 6 are firmly sewed at various points onto the layer lying below them. In such cases they are generally sewed to a plastic carrier to which the gradient coils of the gradient coil layer lying therebelow are applied. This means significant additional work. When the lines are being sewn on there is the additional risk of a cooling line 6 being punctured by a sewing needle and thereby leaking. This leakiness is usually only detected after the complete manufacturing of the gradient coil system 1 with a leak test. A single hole in a cooling line 6 can thus make the complete gradient coil system 1 unusable.

Figure 2:
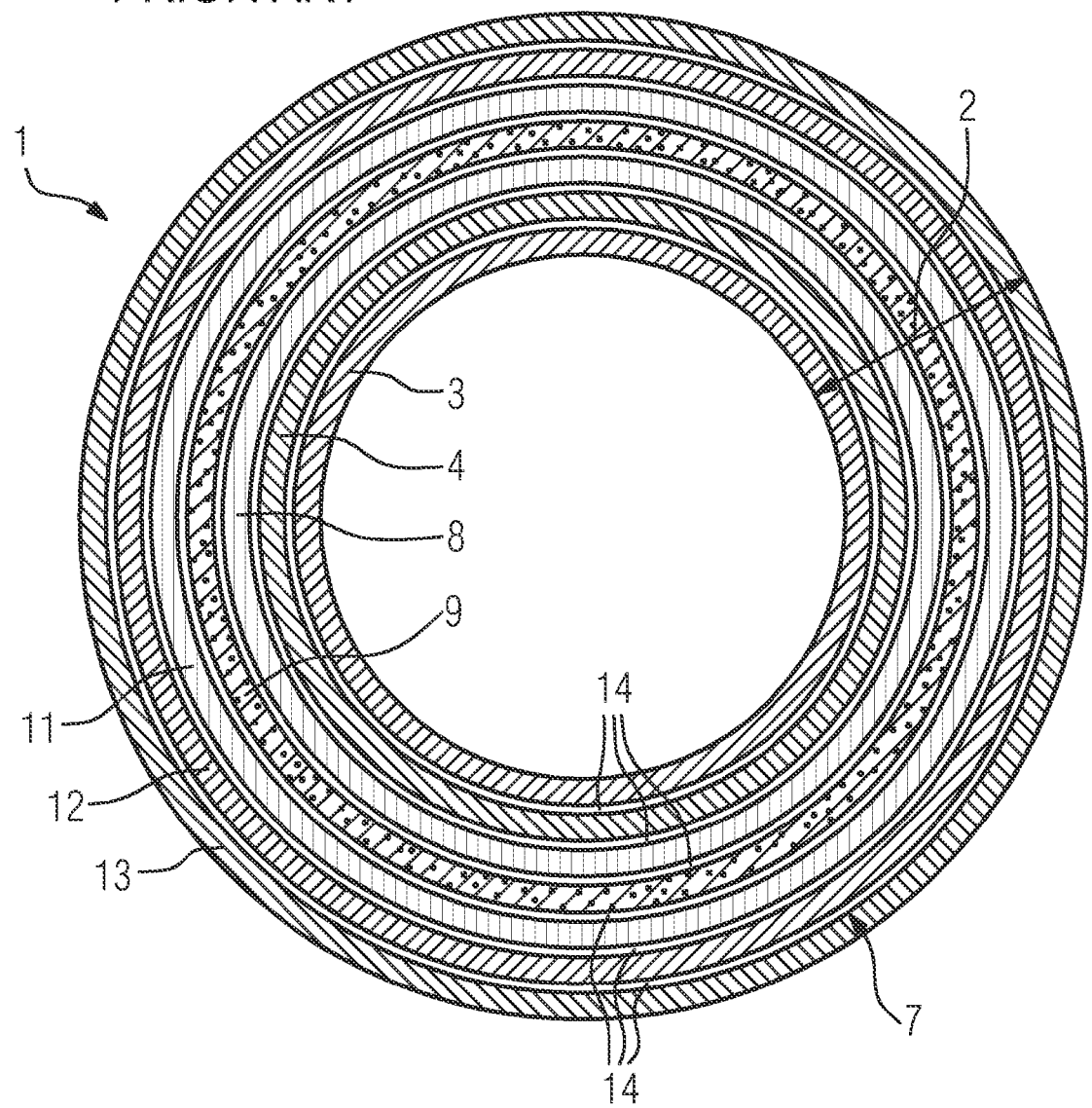
FIG. 2 is a cross-sectional view of a gradient coil system as shown in FIG. 1, with cooling mats according to the prior art.

FIG. 2 shows the gradient coil system 1 known from the prior art with cooling mats 14 as cooling layers 5, 10. As in FIG. 1 the individual gradient coil layers are concentrically-arranged hollow cylinders.

As in FIG. 1, three gradient coil layers 3, 4 and 8 are disposed in the radial direction from inside to outside. These are followed by the shim module 9. The shim module 9, as in FIG. 1, is adjoined by three further gradient coil layers 11, 12, and 13.

Disposed in each case between each two adjacent gradient coil layers, e.g. between the first gradient coil layer 3 and the second gradient coil layer 4 and also between a respective gradient coil layer 3, 4, 8, 11, 12, 13 and the shim module 9, is a cooling mat 14 as the cooling layer 5. The cooling mat 14 has a significantly lower height than the cooling layer 5, 10 with cooling lines 6 as in FIG. 1. The cooling mats 14, like the two cooling layers 5 and 10, remove the heat generated by the gradient coil layers 3, 4, 8, 11, 12, 13. Since the height of an individual cooling layer 5, 10 in FIG. 2 is lower than in FIG. 1, the cooling layer 5, 10 of this type in the form of the cooling mat 14 can be disposed between two respective adjacent layers of the gradient coil system 1 without the height of the overall gradient coil system 1 increasing in the radial direction. Thus, with a comparable height, a greatly improved and evened-out heat dissipation of the heat produced by the gradient coil layers 3, 4, 8, 11, 12, 13 is able to be achieved. The layout of the individual cooling mats 14 is explained in detail in FIGS. 2 and 3.

The spaces between the individual gradient coil layers 3, 4, 8, 11, 12, 13 and the cooling mats 14 after the installation of all layers of the gradient coil system 1 are filled with a plastic matrix. This connects the individual gradient coil layers 3, 4, 8, 11, 12, 13 and cooling mats 14 together into one unit. The plastic matrix 7, produced for example on the basis of an epoxy resin, features fillers with a high thermal conductivity in order to obtain a good transfer of heat from a gradient coil layer to the cooling mats 14. In addition the plastic matrix 7 exhibits an elasticity so that the Lorentz forces acting as a result of the very high currents between the individual gradient coils are accommodated. In this way the mechanical vibrations of the gradient coils in operation are simultaneously damped so that the noise produced by the gradient coil system 1 in operation remains comparatively low.

Figure 3:
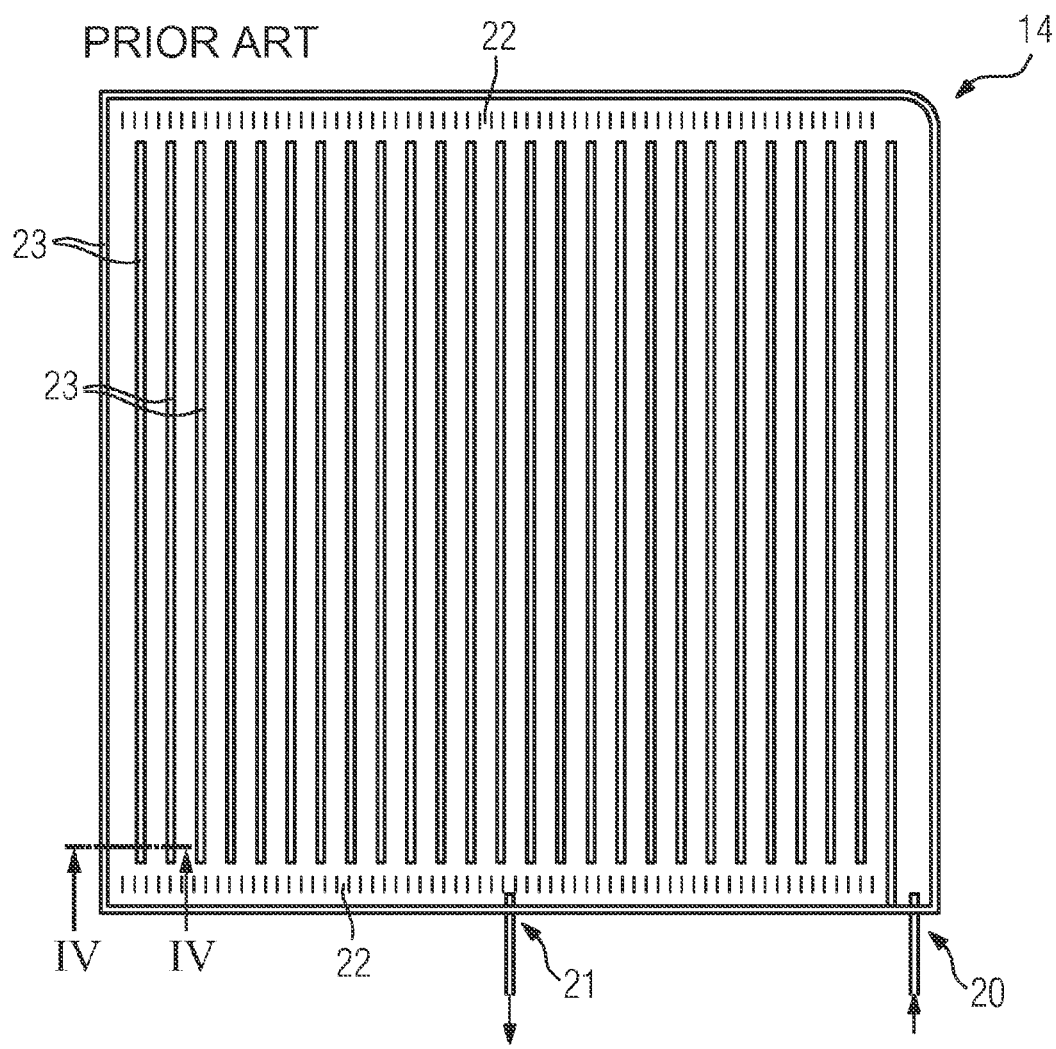
FIG. 3 is a diagrammatic, top plan view of the cooling mat in accordance with the prior art.
Figure 4:
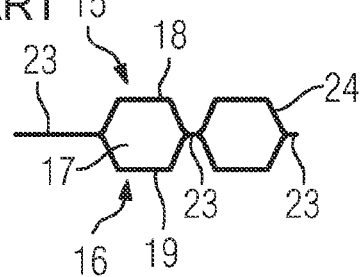
FIG. 4 is a cross-sectional view of the cooling mat taken along the line IV-IV shown in FIG. 3.

FIG. 3 shows a known cooling mat 14 from the prior art described previously in detail viewed from above. In FIG. 4 the cooling mat 14 of FIG. 3 is shown in cross section along the cut line IV-IV. The cooling mat 14 consists of two separate foils 15, 16 made of a thermoplastic material. For embodying a channel geometry with parallel cooling channels 17 the foils 15, 16 are shaped in a reshaping process, e.g. by deep drawing.

Each foil 15 16 with coolant channel sections 18, 19, running vertically in the example shown, has been provided in a deep drawing process, wherein the coolant channel sections 18, 19, after the foils 15, 16 have been laid on top of one another, are joined together into a coolant channel 17 with a stable shape. The coolant channel 17 runs in a roughly serpentine shape from an inlet 20 to an outlet 21 (see FIG. 3), wherein on the end face side respective collective channel sections 22 which are not shown in greater detail in the section are embodied (see FIG. 3). The two foils 15, 16 are joined together in a thermal connection process in the area of the connection sections 23 so that they are liquid-tight. Expediently this takes place directly in the molding tool which has two mold sections, into which the foil 15, 16 can be inserted and deep drawn in each case. The two mold sections are then bought together, through which, by corresponding pressure in the area of the connecting sections 23, the two foils 15, 16 are welded to each other. The completed cooling components can then be removed from the mold.

As is illustrated in FIG. 4, in the prior art example shown, the channel sections 18, 19 can be multisided in cross-section so that overall a hexagonal form of the cross-section of the coolant channel is produced here. Usually the cooling mat 14 is bent for assembly during the construction of the gradient coil, for example by 90° or 180°. In this case the walls of the coolant channels can be stressed into bending. The foils 15, 16, which have a thickness of less than 0.5 mm, are suitably elastic, so that any expansions or compressions that might occur can be easily compensated for.

Only in the area of the collective channels 22 is a correspondingly deformable structure, expediently not shown in the figures for reasons of simplicity, provided in the area of the two foils 15, 16, e.g. as a type of concertina structure. This structure easily allows bending of these collective channels 22 running transverse to the axis of bending.

Figure 5:
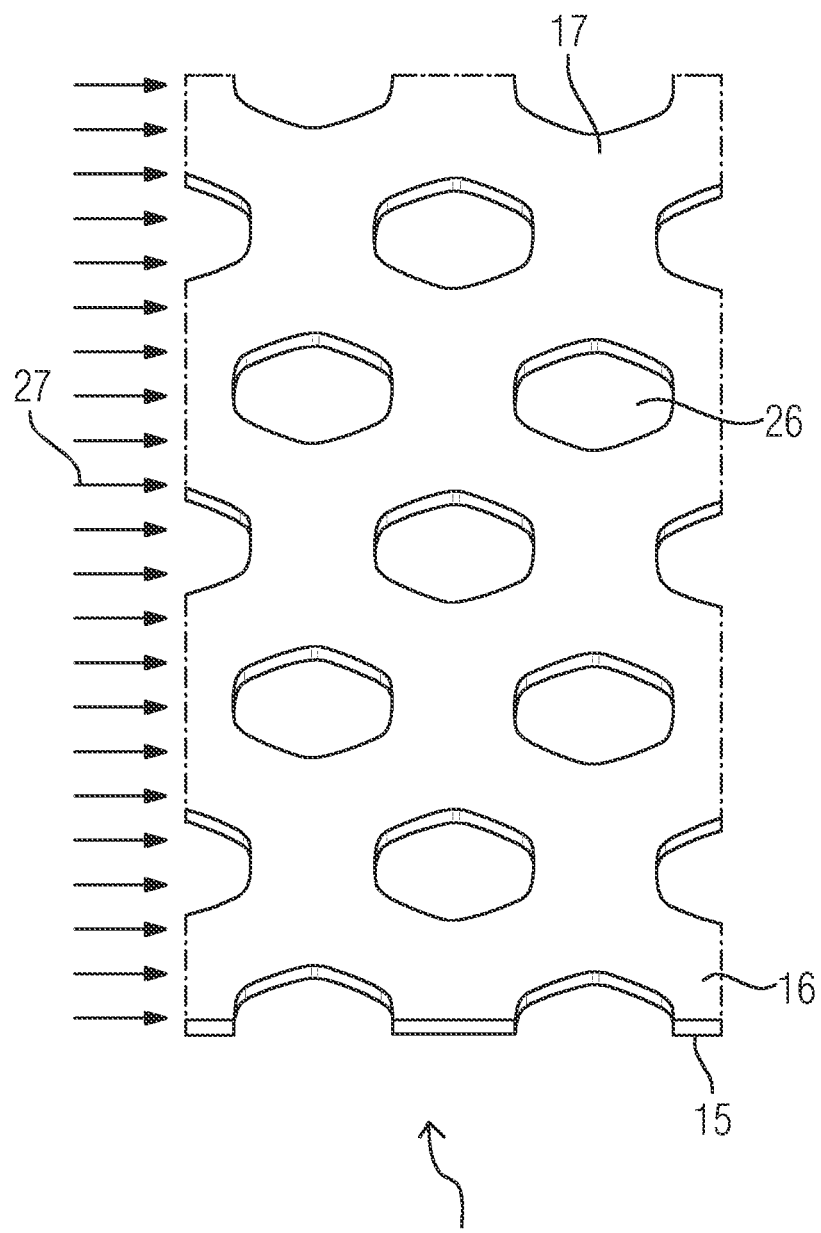
FIG. 5 is a diagrammatic, perspective view of a section of a cooling device in mat form with branched cooling channels according to the invention.

FIG. 5 shows an inventive cooling device 25 with a honeycomb structure of the cooling channels 17. Two separate foils 15, 16 are molded to embody a channel geometry with branched cooling channels 17 in a molding process, as previously described, e.g. by deep drawing. The foils 15, 16 are made of a thermoplastic material for example. Through-openings 26 are embodied in the areas between the cooling channels 17 by punching out for example, which allows casting of the gradient coil system 1 across the layers. Thus the gradient coil system 1 can be cast for example with an epoxy resin and thereby mechanically stabilized. Admixtures to the epoxy resin can affect an improved heat transfer from gradient coil layers 3, 4, 8, 11, 12, 13 to the cooling devices 25 or 14.

The openings 26 can also have other geometries, provided they make a mass passage possible. They can likewise be punched out in the preferably single manufacturing step when the mold parts are moved together, to which end the mold parts have the appropriate profile.

The cooling device 25 or cooling layer 5, 10, 14, as is shown in FIG. 5 for example, is constructed from a stack of precisely two connected foils 15, 16, between which the cooling channels 17 are embodied. This enables the cooling device 25 to be embodied very thin, e.g. with a thickness ranging from 1 to 5 mm.

The multiply-branched channel structure of the cooling channels 17 makes possible a very even distribution of the cooling fluid in the surface, e.g. even across the direction of flow 27 of the cooling fluid indicated in FIG. 5, and thus a good cooling effect, i.e. good transporting away of the heat of the gradient coil layers 3, 4, 8, 11, 12, 13. The small thickness of the cooling device 25 enables a thin gradient coil system 1 to be manufactured, in which, with the same field strength, a larger patient opening can be provided. With the same coil geometry a greater power can be realized. With the same field strength the proportion of copper can also be reduced and the coil diameter can be made smaller which requires smaller dimensions of the basic field magnets and thus saves on superconductive material. This in turn saves money. Manufacturing is also simple and low-cost since no cooling lines 6 have to be laid or disposed at extra expense. The porous structure of the honeycomb cooling channels 17 produced reduces the flow resistance for the cooling fluid by comparison with cooling lines 6. This enables the supply devices for supplying the gradient coil system 1 with cooling fluid to be embodied smaller and at lower cost.

Figure 6:
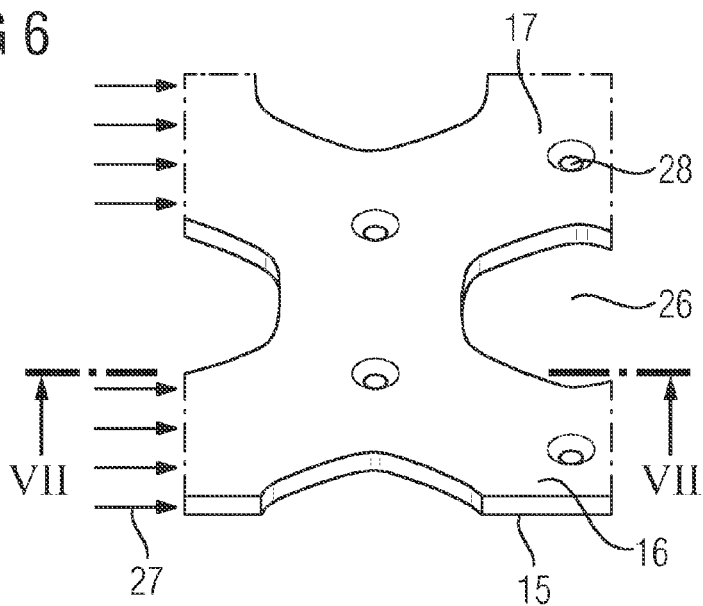
FIG. 6 is perspective view of a section of the inventive cooling device in accordance with FIG. 5, with additional support points for the cooling channels.
Figure 7:
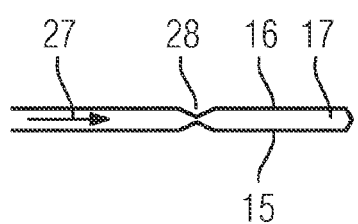
FIG. 7 is a sectional view taken along the line VII-VII shown in FIG. 6.

FIG. 6 shows a further exemplary embodiment of the inventive cooling device 25 which has support points 28 distributed in the cooling channels 17, especially evenly distributed. The support points 28 can prevent the cooling channels 17 narrowing and/or closing during the manufacturing and winding of the gradient coil layers 3, 4, 8, 11, 12, 13 and cooling device layers 25 or during bending of the cooling device 25. FIG. 7 shows a section along the line VII-VII in FIG. 6. The support points 28 can be in the shape of dots, as in the exemplary embodiment illustrated, or also take other forms, such as the form of a bar for example. They can be created simultaneously for example during deep drawing of the foils 15, 16 and thus during the manufacturing of the channel structure.

Figure 8:
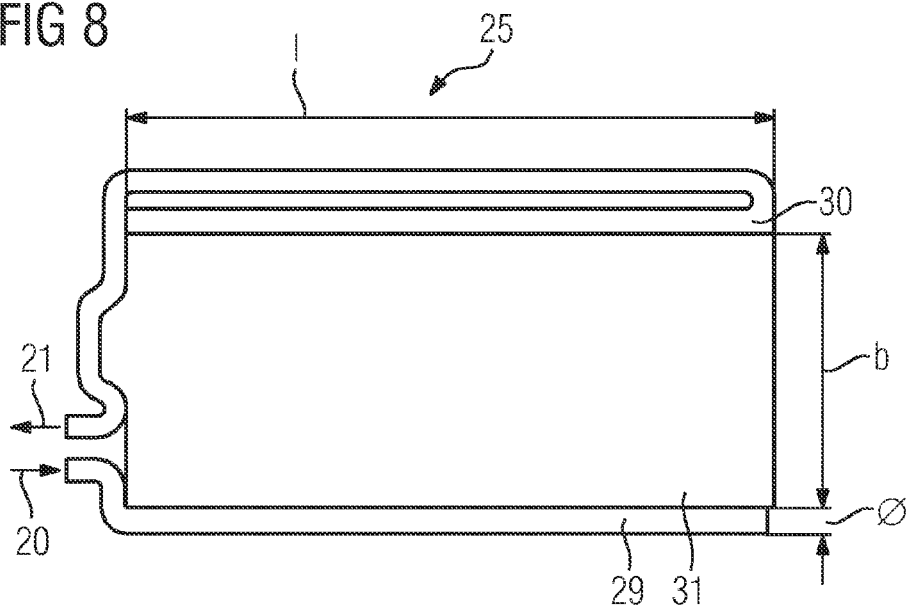
FIG. 8 is an illustration of the inventive cooling devices of FIGS. 5, 6, 7 with inflow and outflow channels.

FIG. 8 shows the inventive cooling device 25 with an inflow and outflow channel 29, 30. The channels 29, 30 lie on opposite sides of a cooling area 31 which is constructed as shown in FIG. 5 or 6. The channels 29, 30 end on a third side next to one another and are equipped at their ends with an inlet 20 or outlet 21 respectively. Cooling fluid can be pumped via the inlet 20 into the cooling device 25 for example and removed again through the outlet 21 of the cooling device 25. The arrows in FIG. 8 indicate the direction of flow of the cooling fluid. Other arrangements of inflow and outflow channel 29, 30 and inlet 20 as well as outlet 21 are also possible. In an exemplary embodiment a length l of the cooling device 25 is in the range of 1132 mm and a breadth b is in the range of 433 mm. A channel diameter ø of the inflow and outflow channel 29, 30 is in the range of 38.2 mm. These can be typical values for a cooling device 25 of gradient systems 1, but other values are possible.

The inside of the channel walls can be provided with a surface structure, e.g. in the form of crossing rills. This surface structure makes it possible to generate a turbulent flow which promotes the transfer of heat from the gradient coils to the coolant (for example water). Instead of the knurled surface structure rills directed inwards can also be used as the surface structure, and also, not shown in any greater detail here burls or similar. This surface structure is directed inwards in each case inwards towards the inside of the channel. This typically also makes it possible to use foils 15, 16 preferably completely occupied by the surface structure right from the start. The surface structure would in this case be provided in all channel sections for example. A connection of the structured foils 15, 16 is easily possible despite the surface structuring, since in the mold parts the thermoplastic material can be heated up and thus softened so that, by corresponding pressure, the surface structures disappear during connection and a full-surface foil welding is produced. Of course the corresponding surface structure can be provided on both channel walls, i.e. on both foils 15, 16.

The foils used consist for example of polycarbonate, but any other thermoplastic can also be used which can be deep drawn in a simple manner and possesses a thermal stability of at least 120° C., which is required to withstand the maximum temperatures prevailing during casting.

The exemplary embodiments described above can be combined with one another but also with exemplary embodiments from the prior art. Dimensions can be adapted in accordance with requirements. The small thickness of the inventive cooling device 25 and the branched form of the cooling channels 17 makes effective cooling via a cooling fluid possible with a small overall thickness of the gradient coil system 1, with which the advantages described previously are connected. Possible material savings and also simpler manufacturing produce lower costs with improved properties. A better distribution of the cooling fluid with reduced flow resistance, even at right angles to the direction of flow 27 of the cooling fluid, improves the cooling effect of the cooling device 25 and makes possible improved removal of heat from the gradient coil system 1.

The invention claimed is:

1. A cooling device to be disposed between two flat coils of a gradient coil of a magnetic resonance imaging apparatus, the cooling device comprising:
   foils including at least one first foil and at least one second foil connected to each other in connected areas such that continuous cooling channels for a cooling fluid are formed, said cooling channels being multiply branched channels, wherein in said connected areas of said foils through-openings are formed through a stack of at least two of said foils and said through-openings are able to be filled with a casting compound, wherein said cooling channels are embodied between precisely two of said foils in one of a straight plane or a curved plane, said cooling channels running completely around some of said through-openings and said through-openings being integral to defining a path of said multiply branched channels.

2. The cooling device according to claim 1, wherein said cooling channels are embodied between precisely two of said foils.

3. The cooling device according to claim 1, wherein said through-openings have a diameter ranging from 5 to 20 mm and a spacing from one another ranging from 20 to 50 mm.

4. The cooling device according to claim 1, wherein said at least two foils have support points embodied against each other in said cooling channels.

5. The cooling device according to claim 1, wherein a totality of said cooling channels has a honeycomb pattern.

6. The cooling device according to claim 1, wherein said foils include a material being a thermoplastic or includes said thermoplastic.

7. The cooling device according to claim 1, wherein said foils each have a material thickness ranging from 0.1 to 0.5 mm.

8. The cooling device according to claim 1, wherein at least one first foil and said at least one second foil are connected to one another by at least one of welding or gluing for good thermal conductivity.

9. The cooling device according to claim 1, further comprising at least one inflow channel and at least one outflow channel for the cooling fluid.

10. The cooling device according to claim 9, wherein a cooling area is formed by said cooling channels, said at least one inflow channel and said at least one outflow channel are respectively disposed on opposing sides of said cooling area.

11. The cooling device according to claim 1, wherein at least one edge length of the cooling device lies in a range between 0.2 and 2 m.

12. The cooling device according to claim 3, wherein said spacing is one of a number of regular spacings.

13. The cooling device according to claim 1, wherein the cooling device has a thickness ranging from 1 to 5 mm.

14. The cooling device according to claim 4, wherein said support points are one of spot connections or spot deep drawing of said at least two foils.

15. The cooling device according to claim 9, wherein said at least one inflow channel and said at least one outflow channel have a channel width ranging from 10 to 50 mm and a channel thickness which is the same for said at least one inflow channel and said at least one outflow channel.

16. The cooling device according to claim 1, wherein all edge lengths of the cooling device lie in a range between 0.2 and 2 m.

17. The cooling device according to claim 10, further comprising fluid connections connected to said at least one inflow channel and said at least one outflow channel on a common side.

18. A method for using a cooling device containing foils including a first foil and a second foil connected to each other in connected areas such that continuous cooling channels for a cooling fluid are formed, the cooling channels being branched, which comprises the steps of:
   forming each of the cooling channels to be multiply branched and the cooling channels are embodied between precisely two of the foils in one of a straight plane or a curved plane, the cooling channels running completely around some through-openings formed in the cooling channels and the through-openings being integral to defining a path of said multiply branched channels; and
   placing the cooling device between two flat coils of a gradient coil of a magnetic resonance tomography to remove heat arising when power is applied to the two flat coils by means of the cooling fluid flowing in the cooling device.

19. The method according to claim 18, which further comprises providing a plurality of cooling devices with minimized thicknesses and disposed between the two flat coils.

20. The method according to claim 19, which further comprises using the cooling devices and the two flat coils in a number of layers above one another disposed on a cylinder surface and cast to one another with a resin.

21. The method according to claim 18, which further comprises providing water as the cooling fluid.

* * * * *